(12) United States Patent
Gupta et al.

(10) Patent No.: US 8,983,023 B2
(45) Date of Patent: Mar. 17, 2015

(54) DIGITAL SELF-GATED BINARY COUNTER

(71) Applicants: Naman Gupta, Delhi (IN); Amol Agarwal, New Delhi (IN); Gaurav Goyal, Dehradun (IN)

(72) Inventors: Naman Gupta, Delhi (IN); Amol Agarwal, New Delhi (IN); Gaurav Goyal, Dehradun (IN)

(73) Assignee: Freescale Semiconductor, Inc., Austin, TX (US)

( * ) Notice: Subject to any disclaimer, the term of this patent is extended or adjusted under 35 U.S.C. 154(b) by 48 days.

(21) Appl. No.: 13/935,552

(22) Filed: Jul. 4, 2013

(65) Prior Publication Data

US 2015/0010124 A1  Jan. 8, 2015

(51) Int. Cl.
| | | |
|---|---|---|
| *H03K 23/00* | (2006.01) | |
| *H03K 23/40* | (2006.01) | |
| *H03K 21/12* | (2006.01) | |
| *H03K 21/38* | (2006.01) | |
| *H03K 23/58* | (2006.01) | |

(52) U.S. Cl.
CPC .............. *H03K 23/40* (2013.01); *H03K 21/12* (2013.01); *H03K 21/38* (2013.01); *H03K 23/58* (2013.01)
USPC .............................. 377/118; 377/119; 377/44

(58) Field of Classification Search
None
See application file for complete search history.

(56) References Cited

U.S. PATENT DOCUMENTS

| | | | | |
|---|---|---|---|---|
| 4,396,829 A | * | 8/1983 | Sugihara et al. | 377/54 |
| 5,020,082 A | * | 5/1991 | Takeda | 377/44 |
| 5,818,895 A | * | 10/1998 | Oh | 377/118 |
| 6,269,138 B1 | * | 7/2001 | Hansson | 377/26 |
| 6,434,588 B1 | | 8/2002 | Kim | |
| 6,795,520 B2 | * | 9/2004 | Van Der Valk | 377/115 |
| 6,961,402 B1 | * | 11/2005 | Younis | 377/44 |
| 7,145,978 B2 | | 12/2006 | Lewis | |
| 2002/0075989 A1 | | 6/2002 | Joo | |
| 2012/0008733 A1 | * | 1/2012 | Yoon et al. | 377/118 |

OTHER PUBLICATIONS

Saleh Abdel Hafeez and Ann Gordon-Ross, A Digital CMOS Parallel Counter Architecture Based on State Look-Ahead Logic, IEEE Transactions on Very Large Scale Integration (VLSI) Systems, vol. 19, No. 6, Jun. 2011, pp. 1023-1033.

* cited by examiner

*Primary Examiner* — Tuan T Lam
(74) *Attorney, Agent, or Firm* — Charles Bergere

(57) ABSTRACT

An n-bit counter is formed from cascading counter sub-modules. The counter includes combinatorial control logic coupled to a lower order counter sub-module. The control logic is arranged to clock gate at least one higher order counter sub-module dependent on a logical combination of outputs of the lower order counter sub-module and where the control logic uses pipelining to store at least one previous control logic output for use in determining a later control logic output.

19 Claims, 13 Drawing Sheets

New approach 2-bit Counter Module
(CNT - i,i+1)
400$_{i,i+1}$

CGIC : Clock Gating
Integrated Cell
500

900

US 8,983,023 B2

1

DIGITAL SELF-GATED BINARY COUNTER

BACKGROUND OF THE INVENTION

The present invention relates to digital counter circuits and, more particularly, to digital binary counter circuits.

A digital binary counter circuit is a logic circuit used for counting the number of times a particular event has occurred with respect to a base clock signal (CLK). A counter may be any arbitrary length (i.e., up to n-bits in length), with the maximum number of countable events being related to the counter bit length. For example, an 8-bit counter can count up to 256 events (i.e., up to $2^8$), while a 16-bit counter can count up to 65,536 events (i.e., up to $2^{16}$), etc.

Counter circuits are used in many integrated circuit designs, for example in an System on Chip (SoC), and may be formed of a set of sequential elements, such as flip-flops, operatively coupled together with suitable combinatorial control logic. As more features are being integrated into digital circuits, such as SoC's, the number of flip-flops used for the counter circuit portions, and therefore the amount of control logic used, is increasing. Furthermore, higher throughput necessitates operating such digital counters at ever higher frequencies. All this leads to a significant increase in dynamic power consumption of digital counters, or limited operational frequencies.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
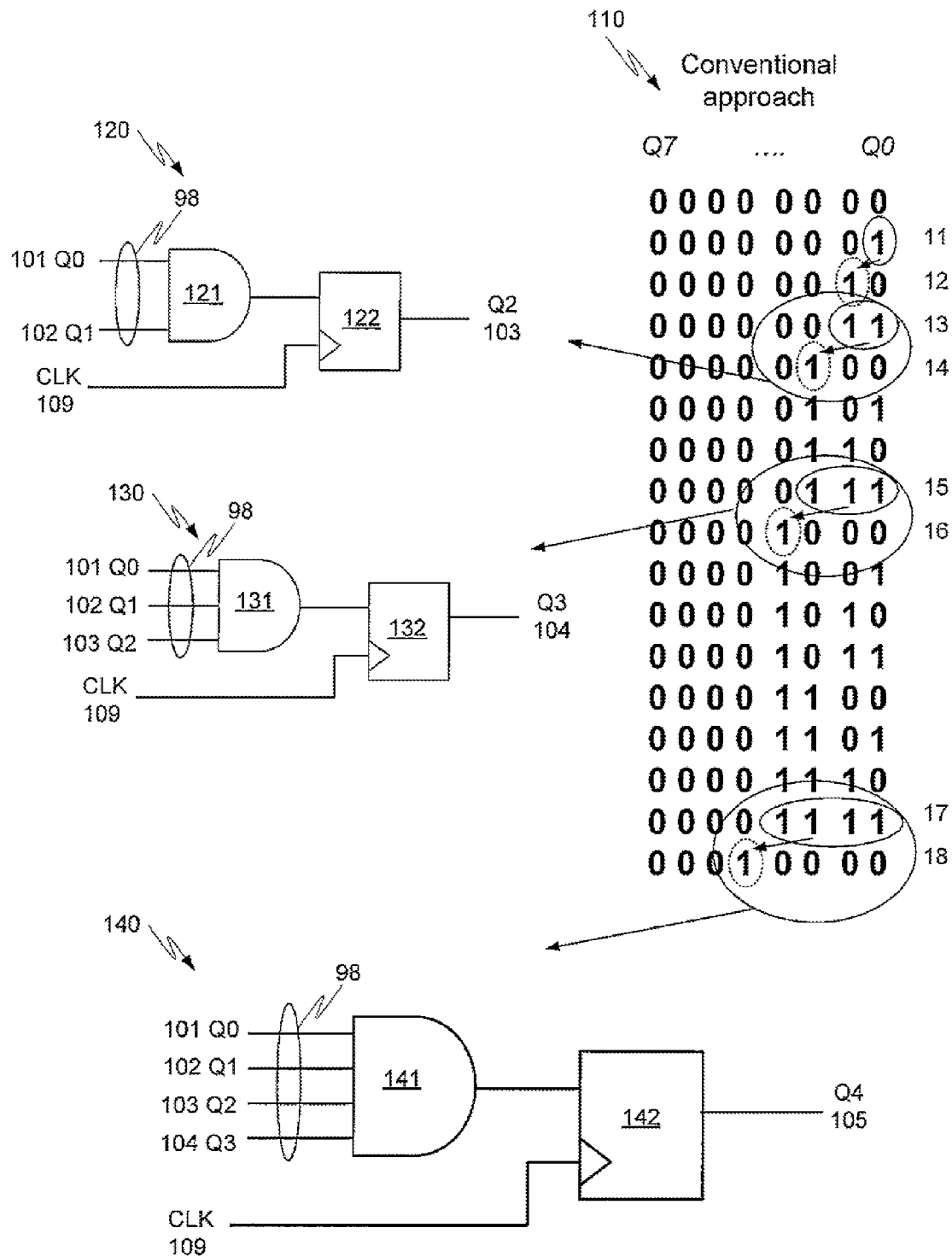
FIG. 1 is a schematic block diagram and truth table of a conventional approach to controlling the toggling of a portion of a counter circuit.

The present invention provides a binary counter that can operate at high frequency while consuming low dynamic power. Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

One way to increase throughput of a digital circuit is to increase operational frequency, but increasing frequency is limited not only by timing closure challenges (e.g., the difficulties in meeting the setup timing check between flip-flops, as the operational frequency increases), but also by increases in dynamic power consumption of the overall digital circuit (e.g., due to the switching losses in the circuitry, which are increased by increasing operational frequency). Embodiments of the present invention may reduce the power consumption of digital counter circuits by employing clock gating of higher order counting portions so that those higher order portions of the circuit are only enabled for operation when actually required (as opposed to all the time), hence reducing/removing the switching losses for the disabled portions.

Moreover, the present invention increases operational frequency of the overall digital counter by limiting the fan-in and number of logic tiers (hereinafter this limitation may be called 'cone size') used for the combinatorial control logic that controls the enablement of respective ones of the counter sub-modules that are coupled together to form the overall digital counter. The limitation of the cone-size includes pipelining of prior logic results, where necessary, to ensure the maximum fan-in is kept equal to the bit depth of the counter sub-modules used to form the overall digital counter (e.g., 2-bit counter sub-modules=fan-in of 2, 3-bit counter sub-modules=fan-in of 3, 4-bit counter sub-modules=fan-in of 4, etc.). The limitation of the cone-size also includes keeping to a maximum of two logic tiers/levels for the combinatorial control logic, i.e. the combinatorial control logic only includes up to two logic gates between any two sequential elements of the design (e.g. two pipelining flip-flops).

The combinatorial control logic may be considered as a plurality of instances of control logic, where each instance controls the enablement of the next higher order counter sub-module. Where a particular control logic instance may already utilise logic gates coupled together such that the total fan-in is equal or less than the bit-depth of the counter sub-modules, and the number logic gate tiers/levels is equal to or less than 2, then the pipelining flip-flop may be omitted. These, and all other, aspects of the invention will be described in more detail below, in the context of a 4-bit, 8-bit and 16-bit counters formed from 2-bit counter sub-modules, and a 12-bit counter formed from 3-bit counter sub-modules, respectively, from which it will become apparent how aspects of the invention (i.e., using pipelining—where applicable—and clock gating) may be applied to any n-bit counter, to enable lower power consumption and faster operational frequency.

Examples may provide an n-bit counter circuit formed from a plurality of cascading counter sub-modules that include combinatorial control logic coupled to a lower order counter sub-module of the overall counter circuit, where the combinatorial control logic may be arranged to clock gate at least one higher order counter sub-module of the counter circuit based upon an logical combination of outputs of the lower order counter sub-module, but may also include combinatorial control logic that may be arranged to use pipelining to store at least one previous combinatorial control logic output for use in determining a later combinatorial control logic output.

The plurality of cascading counter sub-modules may be considered to each have a bit depth and the combinatorial control logic may comprise up to two tiers of logic gates, where the first tier may be a plurality of logic gates, and the second tier a single logic gate. The first tier of a plurality of logic gates may form at least one input to a second tier logic gate, and the first tier may have a fan-in equal to the bit depth of the counter sub-modules, and the second tier may have a fan-in of two. The first and second tiers of logic gates may comprise AND gates.

The pipelining may comprise a flip-flop arranged to store the at least one previous combinatorial control logic output for use in determining a later combinatorial control logic output dependent on a clock signal. The flip-flop may be a D-type flip-flop.

The pipelining may be operable to ensure a fan-in of a first tier of combinatorial control logic gates is equal to a bit depth of the plurality of cascading counter sub-modules.

Example n-bit counter circuits may further comprise at least one clock gating cell coupled between the lower order counter sub-module and the higher order counter sub-module, where the clock gating cell controls a clock input of the higher order counter sub-module. Exemplary clock gating cells may comprise a latch having an output operatively coupled to a first input of a two input AND gate, where the latch is operated by a changing logic level of a clock signal. The clock signal may be operatively coupled to a second input of the two input AND gate and an input to the latch may be a logically ANDed output of the lower order counter sub-module.

The lower order counter sub-module may be operable to count a two least significant bits of the counter circuit and the higher order counter sub-module may be operable to count a next two more significant bits of the counter circuit. The lower order counter sub-module may also be operable to count a two least significant bits of the counter circuit and the higher order counter sub-module may be operable to count a next two more significant bits of the counter circuit. The input to the latch may be the logically ANDed output of the lower order counter sub-module and a least significant bit input to an AND gate may be operably coupled to the output of the lower order counter sub-module and may be an inverted input. A clock gating cell may be provided between each of the plurality of counter sub-modules. Examples may be particularly higher than 4-bit counter.

The counter circuit may be formed from a plurality of 2-bit counter sub-modules, and, in which case, the combinatorial control logic may be arranged to ensure a maximum fan-in of the combinatorial control logic of 2. The combinatorial control logic may comprise a first tier of two, 2-input AND gates, and a second tier of a single 2-input AND gate. The control logic may further comprise a flip-flop operatively coupled between an output of the first tier of logic gates, and an input to the second tier logic gate. The flip-flop may be clocked by a base clock signal.

Examples may provide an instance of the control logic instance per instance of a higher order counter sub-module of the counter circuit. The at least one higher order counter sub-module of the counter circuit may be the next higher order counter sub-module after the lower order counter sub-module.

The plurality of cascading counter sub-modules may comprise a first, lowest order, counter sub-module followed by a second, higher order, counter sub-module cascaded off the first counter sub-module, where each subsequent counter sub-module cascades off a previous counter sub-module and is a yet higher order counter sub-module.

Examples may also provide an n-bit counter circuit, comprising an initial 4-bit counter sub-portion, wherein the initial 4-bit counter sub-portion comprises a first 2-bit counter sub-module arranged to count a two least significant output bits Q0 and Q1 of the n-bit counter circuit, a second 2-bit counter sub-module arranged to count a next two more significant output bits of the n-bit counter circuit, Q2 and Q3 and combinatorial control logic arranged to control a clock of the second 2-bit counter sub-module dependent on the outputs of the first 2-bit counter sub-module. The combinatorial control logic may comprise an AND gate arranged to determine a logical AND combination of Q1 and Q0 and a clock gating cell operable to clock gate the second 2-bit counter sub-module.

In some examples, the clock gating cell may comprise a latch having an output operatively coupled to a first input of a two input AND gate, where the latch is operated by a changing logic level, e.g., a falling level, of a clock signal, and the clock signal may be operatively coupled to a second input of the two input AND gate and an input to the latch may be a logically ANDed output of the lower order counter sub-module. The logical combination of Q1 and Q0 used may be (Q1 AND /Q0) and the combinatorial control logic may further comprise a pipelining flip-flop arranged to store an output of the AND gate dependent on a base clock signal.

The aforementioned examples will now be described in more detail. A counter circuit is a periodic state machine. For example, in any n-bit counter, the last two bit values (i.e., 2 LSBs) will always change from 00->01->10->11. Therefore, a pipelining technique can be employed to register previous clock cycle data, and in next clock cycle(s), a pipelined register output can be used to generate desired output logic in combination with other logic operating on the current input signals. Thus, pipelining is able to reduce combinational cone size (i.e., fan-in and associated number of logic tiers) to the counter flip-flops and hence enable higher frequency operation. This issue is explained in more detail in FIGS. 1 and 2, below.

FIG. 1 shows a conventional approach to controlling the toggling of a portion of a conventional counter circuit. In particular, there is shown a first portion of a logic state diagram 110, showing how counter bits Q0 to Q7 change for the first 17 clock cycles, and associated control logic portions 120, 130 and 140, for different order bits of the counter circuit.

In general, for the conventional approach, it can be seen that any given higher order bit only toggles (i.e., in this case, flips from binary logic value '0' to binary logic value '1') when all lower order bits (LSBs) are also binary logic value '1'. Thus, for example, as shown in FIG. 1, Q1 only toggles to binary logic value '1', at line 12, once Q0 has already turned to binary logic value '1', at line 11. Similarly, Q2 only toggles to binary logic value '1' at line 14, after both Q0 and Q1 have toggled to binary logic value '1', at line 13, and so on and so forth for each of the output bits of the counter. The similar situations for Q3 and Q4 are also shown at lines 15/16, and lines 17/18, respectively, of state logic diagram 110.

The control logic portions 120-140 for counter output bits Q2 to Q4, respectively, are shown on the left hand side of FIG. 1. (Note, the control portions for counter output bits Q0 and Q1 are omitted as they are very simple). Q2 control logic portion 120 comprises a two input AND gate 121, with inputs Q0 101 and Q1 102, feeding into a D flip-flop 122, which is fed by the clock signal 109, to form output Q2 103. The D flip-flop 122 stores the logic output of AND gate 121 until the next clock edge. It is to be noted that fan-in 98 for the two input AND gate 121 is 2.

Taking note of the logic state diagram 110, Q3 control logic portion 130 comprises a three input AND gate 131, with inputs Q0 101, Q1 102 and Q2 103, feeding into a D flip-flop 132, which is fed by the clock signal 109, to form output Q3 104. The D flip-flop 132 stores the logic output of AND gate (3-input AND gate 131 in this case) until the next clock edge. It is to be noted that fan-in 98 is now 3.

In a similar fashion, Q4 control logic portion 140 comprises a four input AND gate 141, with inputs Q0 101, Q1 102, Q2 103 and Q3 104, feeding into a D flip flop 142, which is fed by the clock signal 109, to form output Q4 105. The fan-in 98 is now 4, and, in general, it can be seen that the fan-in increases by one for each additional higher order bit of the counter. Thus, a conventional counter can rapidly reach a very high fan-in for the associated control logic.

The above describes, in effect, all the combinatorial control logic needed for a 5-bit counter (i.e., having outputs Q0 to Q4), but the approach can be extrapolated out to any order counter. Thus, similarly, an 8-bit counter would require AND-ing of the first 7 bits (i.e., Q0-Q6) to provide the output for Q7, and the performance of such a counter would be limited by the significant delay of a 7-input AND gate, or alternatively, 6 AND gates in series.

Figure 2:
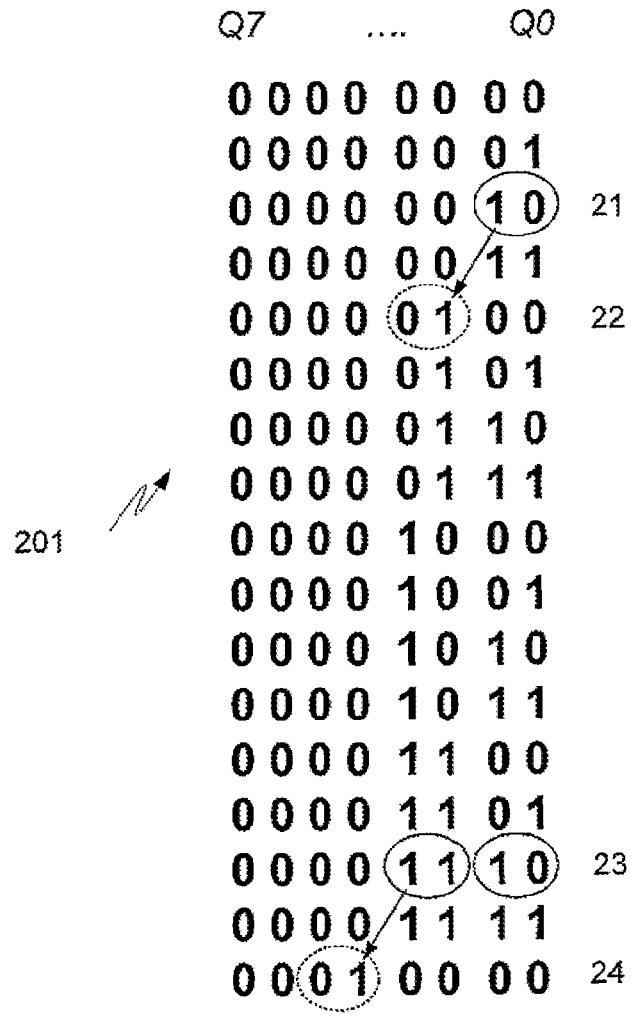
FIG. 2 is a schematic block diagram and truth table illustrating an example of pipelining according to an embodiment of the present invention.
Figure 2:
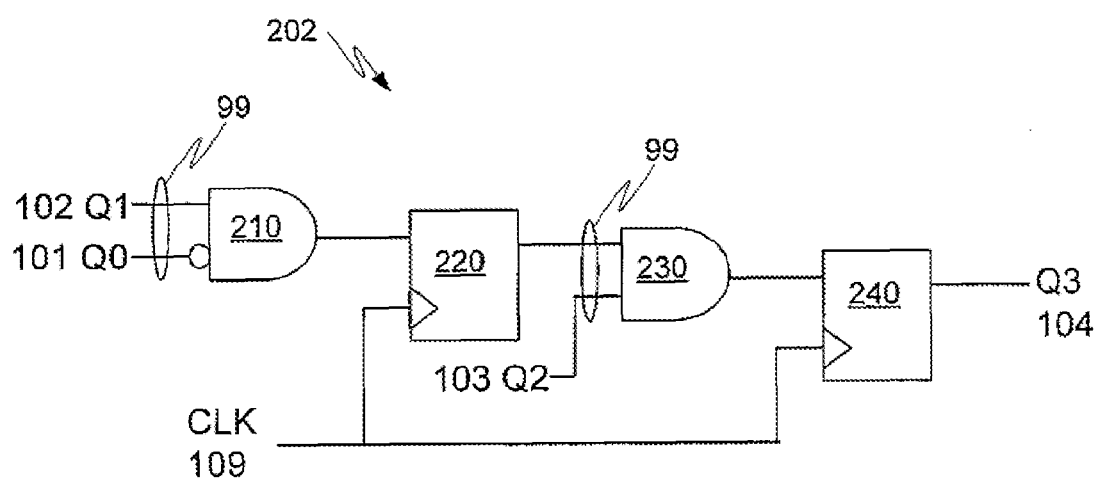

FIG. 2 shows an example of a pipelining approach for the combinatorial logic according to an embodiment of the present invention, for example where modules of 2-bit counters have been used. The individual 2-bit counter sub-modules may be considered to be in a cascading formation. FIG. 2 includes a state diagram 201 and respective simplified example pipelining circuit portion 202. In this figure, only the basic principle of pipelining is shown, without over complication by including all the other portions of the overall counter circuit.

In this example, the pipeline comprises a first two input AND gate 210 coupled to inputs Q0 101 and Q1 102. In this example, the first AND gate 210 is set up to actually detect the signal Q1 AND /Q0 (note, as used herein, "/" is used to refer to an inverse of a signal, so /Q0 means the inverse or NOT of Q0), for reasons explained in more detail below. The output of the first two input AND gate 210 is the input to a first pipelining D flip-flop 220 (operated by a clock signal, for example base clock signal CLK 109 used elsewhere in this description), which in turn feeds a second two input AND gate 230 as its first input, with the second input of AND gate 230 being Q2 103. The output of the second two input AND gate 230 is the input into a second pipelining D flip-flop 240 (also operated by the clock signal, e.g., CLK 109). Thus, "pipelining" may be viewed as storing an already determined combinational logic result in a memory, such as D flip flops 220 or 240, for use in a later occurring further combinational logic. Using this pipelining approach allows the individual AND gates to remain two-input, so the fan-in 99 of this pipelined approach remains 2 throughout. This means that the fan-in is not increasing as the counter increases in size, hence the resultant counters (mainly higher order counters) are not limited to an operational frequency determined by fan-in greater than 2 (in this example, using 2-bit counter sub-modules), and hence can operate at higher frequencies than conventional counters.

As discussed above, under the conventional approach, a higher order bit is dependent on all of the lower order bits being binary logic value '1'. However, when using a pipelining approach introduced above, i.e., using a D flip-flop, the D flip flop holds the value for 1-clock cycle. For this reason the first AND gate 210 is arranged to detect the inputs Q1 AND /Q0, because, the input '10' occurs one clock cycle before the conventionally sought input '11'. For counter output bit Q2, only the first two bits, i.e., Q0 and Q1, matter for its determination. This is shown in the state logic diagram 201 at line 21 and 22. However, for the counter output bits above Q2, when using the disclosed pipelining approach and 2-bit counter sub-modules to form the overall digital counter circuit, the counter combinatorial control logic may be arranged to detect '10' for Q1 and Q0 (i.e., the respective counter circuit portion may be arranged to detect Q1 AND /Q0), and '11' for the higher order bits (i.e., the respective further counter circuit portion may be arranged to detect Q2 AND Q3), and AND'ing the results together. This is depicted in the state logic diagram 201 at lines 23 and 24.

While the above-described pipelining approach reduces the fan-in of the combinatorial control logic, thereby increasing operational frequency, examples of the invention also make use of clock gating to only enable counter circuit portions (i.e., the individual 2-bit counter sub-modules) as they are required, instead of all the time. It happens that the enablement of the required portions of the overall counter circuit may be carried out also on the basis of the combinatorial control logic. Thus, the improved combinatorial control logic of the invention in effect serves two synergistic purposes.

The methodology used for controlling the clock gating of different portions of the overall digital counter circuit will now be described in more detail.

Not all bits of an 'n' bit counter actually toggle all time during one complete counter cycle (where a 'counter cycle' is a complete cycle of counting from 0 to the highest count value the counter is capable of reaching, which is dependent on its bit depth). For example, for a 8 bit counter, counting from 00000000 to 11111111, during the first five cycles of operation, the output is 00 00 00 00->00 00 00 01->00 00 00 10->00 00 00 11->00 00 01 00. This shows that the six most significant bits of the overall digital counter output do not toggle until the fifth clock cycle. Therefore, the clock can be gated for these higher order portion(s) of the counter, and so on. Thus, examples of the present invention also provide power savings by clock gating unused portions of the overall counter circuit (generally the higher order/more significant bits), until they are actually ready for use. This is in contrast to conventional counter clock logic paths, that typically toggle continuously while the counter is in operation, regardless of whether their state is changing or not.

Aspects of the lower power operation of examples of the invention are described in more detail with reference to FIG. 3, which shows an example of a new approach to controlling the toggling of a portion of a counter circuit according to an example of the invention.

Figure 3:
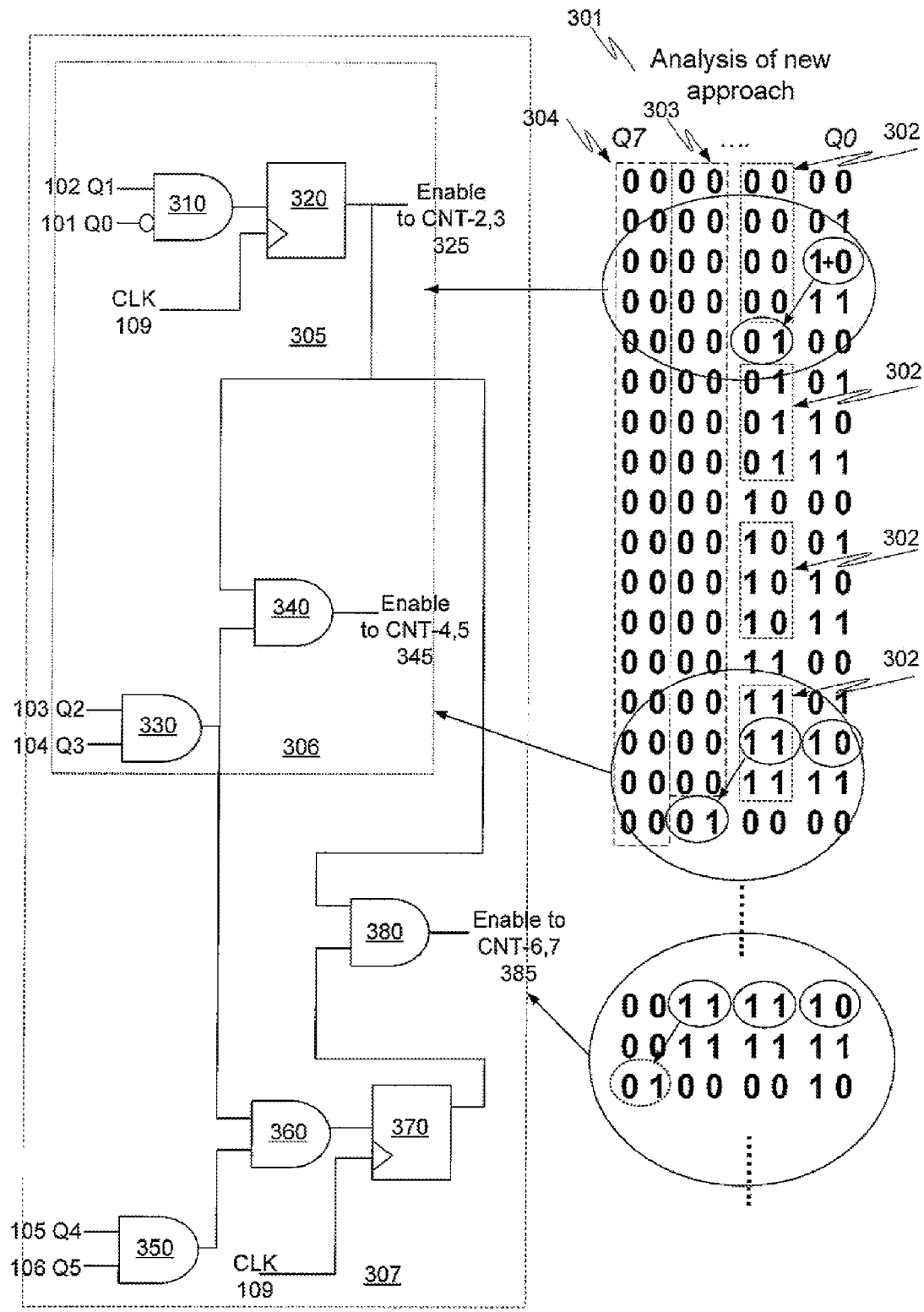
FIG. 3 is a schematic block diagram and a truth table illustrating a circuit for controlling the toggling of a portion of a counter circuit according to an embodiment of the present invention.

In FIG. 3, a state diagram 301 shows portions that remain unchanged during the counting clock cycles shown. These areas include, for example, areas 302 for counter bits Q2 and Q3, area 303 for counter bits Q4 and Q5, and area 304 for counters bits Q6 and Q7 (as far as shown in the extract). During all these periods, it can be seen that the respective counter output bit values are unchanging, and as such, the counter circuit portions dealing with these can be turned off, by being clock gated.

Accordingly, examples of the invention use combinatorial control logic that detects certain bit arrangements that are seen in advance of the respective higher order bits turning from '0' to '1', and provide enable signals for the higher order counter sub-modules dependent thereon (in the examples shown, counter sub-modules are 2-bit, but other bit depth counter modules may be used instead). This approach allows counter circuits in accordance with embodiments of the present invention to enable the higher order counter portions (i.e., the respective 2-bit counter sub-module) in time for when they are needed. FIG. 3 only shows the provision of enable signals for each of the multiple 2 bit counter sub-modules forming the overall digital counter circuit. In this description, the 2-bit counter sub-modules are named according to the output bits of the overall digital counter they provide—i.e., the 2-bit counter sub-module providing bits Q0 and Q1 is called CNT-0,1, the 2-bit counter sub-module providing bits Q2 and Q3 is called CNT-2,3, etc. The signals used by these circuits, such as enable signals, are named in a similar fashion.

In FIG. 3, there is shown at the top of the figure a first combinatorial (enable) control logic portion 305 arranged to detect (Q1 AND /Q0) using AND gate 310, as discussed previously, the result of which is pipelined through a D flip-flop 320, operated by the base clock signal CLK 109. This provides the enable signal 325 for the second 2-bit counter sub-module in the overall digital counter circuit, i.e., counter sub-module CNT-2,3, which when turns to binary logic value '1' (i.e., goes high), enables the clock to the 2-bit counter sub-module that is counting overall digital counter circuit output bits Q2 and Q3, CNT-2,3. The pipelining approach means this CNT-2,3 enable signal 325 also acts as an input for other, subsequent, AND gate control logic arrangements used to control the enable signals for higher order counter sub-modules, as discussed below.

FIG. 3 also shows, in the middle of the figure (left hand side), a second (enable) control logic portion 306 arranged to detect (Q3 AND Q2) AND (pipelined[Q1 AND /Q0]), in order to provide the enable signal 345 for the third 2-bit counter sub-module, i.e. counter CNT-4,5, which enables the clock to the 2-bit counter sub-module that is counting overall digital counter output bits Q4 and Q5.

Finally, FIG. 3 also shows, at the bottom of the figure, a third (enable) control logic portion 307 arranged to detect (pipelined [(Q5 AND Q4) AND (Q3 AND Q2)]) AND (pipelined [Q1 AND /Q0])), in order to provide the enable signal 385 for the fourth 2-bit counter sub-module, i.e., counter CNT-6,7, which enables the clock to the 2-bit counter sub-module that is counting overall digital counter circuit output bits Q6 and Q7.

These three (enable) control logic portions 305-307 are merely exemplary of the general pipelined control logic scheme used to provide the enable signals for clock gated (i.e., temporarily unused) higher order/bit portions of the overall digital counter circuit according to examples of the invention, in order to save dynamic power (and to maximise operational frequency by limiting cone size).

The respective portions of the control logic are formed from suitably arranged logic gates, latches and the like. For example, the second combinatorial enable control logic portion 306 is formed from combining the output of first enable control logic portion 305 and AND'ing it (using AND gate 340) with the output of another AND gate 330, which is operable for AND'ing Q2 and Q3. In a similar way, third enable control logic portion 307 may be formed from combining the output of first enable control logic portion 305 and AND'ing it (using AND gate 380) with a pipelined output (through D-type flip-flop 370, also controlled by the base clock signal CLK 109) of (Q5 AND Q4) AND (Q3 AND Q2)—i.e., using AND gates 350, 360 and 330, respectively. The later/higher order counter enable signals are derived in similar fashion, the general principles of which are explained in more detail below, especially with reference to FIG. 13.

The other basic building blocks of an overall digital counter circuit according to an example of the invention will now be described with reference to FIGS. 4 to 6.

Figure 4:
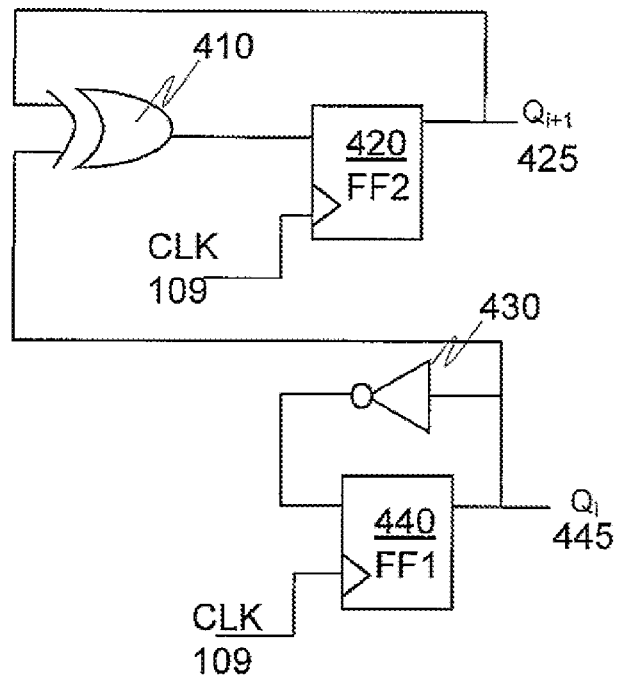
FIG. 4 is a schematic block diagram of a 2-bit counter (sub-)module according to an embodiment of the present invention.

FIG. 4 schematically shows a 2-bit counter sub-module used in examples according to the invention. It is shown in generic representation, i.e., it is shown as counting two consecutive output bits ($=Q_i$ and $Q_{i+1}$) of the overall counter circuit, hence is referred to as CNT-i,i+1, and referenced in the figure here, and later on as $400_{i,i+1}$. The values i and i+1 are to be replaced with the respective values of the output bits of the counter module, e.g., for Q0 and Q1, the counter is CNT-0,1, referenced as $400_{0,1}$, etc.).

The 2-bit counter sub-modules comprise a second D flip-flop 420, the output of which is $Q_{i+1}$ 425 (i.e., the highest order output bit for the overall 2-bit counter sub-module). This output 425 feeds back to be a first input to an XOR gate 410. The output of the XOR gate 410 is the input to the second D flip-flop 420, which is operationally clocked by a clock signal, e.g., the base clock signal CLK 109. The other input to the XOR gate 410 is the output of a first D flip-flop 440, which is also the lowest order output bit of the 2-bit counter sub-module, i.e., $Q_i$ 445. The input of the first D flip-flop 440 is an inverted version of the output $Q_i$ 445, provided by a NOT gate 430 coupled between the output 445 of the first D flip-flop 440, and the input to the first D flip-flop 440, as shown. The first D flip-flop 440 is also operationally clocked by the same clock signal as the second D flip-flop 420, e.g., base clock signal CLK 109.

Figure 5:
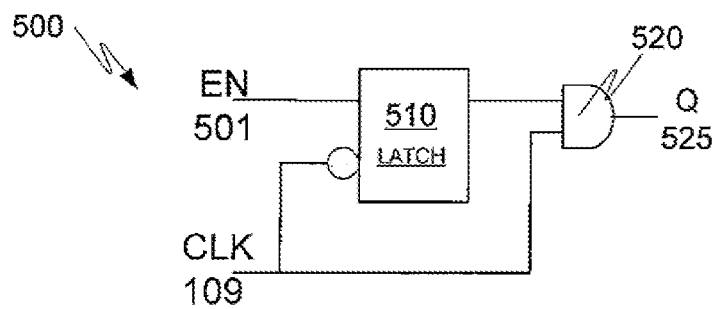
FIG. 5 is a schematic block diagram of a Clock Gating Cell (CGC) for use in clock gating the counter modules of FIG. 4 when they are not changing states in accordance with an embodiment of the present invention.

FIG. 5 shows an example of a Clock Gating Cell (CGC) 500 for use in clock gating higher order bits (relative to the particular instance of the CGC involved), according to an example of the invention. Multiple instances of the CGC circuit are used in any given counter circuit, dependent on the bit size of the overall digital counter circuit and/or the bit-depth and the number of the n-bit counter sub-modules used (see FIGS. 7, 8, 11 and 16, for 4-bit, 8-bit, 16-bit and 12-bit overall digital counter circuits, using 2-bit and 3-bit counter sub-modules, respectively). For example, one CGC per 2-bit or 3-bit counter sub-module. The CGC 500 comprises an enable signal 501 feeding into the input of a D-type latch 510, the output of which forms the first input to a two input AND gate 520, to provide the output Q 525. The enable signal 501 used for each instance of the CGC is dependent on which subsequent counter sub-module is being enabled by the particular instance of the CGC, but is generally derived from an earlier combinatorial logic calculation (which may be pipelined for the later stages)—see FIG. 3. For example, Q1 AND /Q0 is used for the first CGC that controls the enable signal for the subsequent 2-bit counter sub-module CNT-2,3, whereas (Q3 AND Q2) AND (pipelined[Q1 AND /Q0]) (i.e., the output of the second combinatorial enable control logic portion 306 discussed with reference to FIG. 3 above) is used for the second CGC circuit that controls the enable signal for the subsequent 2-bit counter sub-module CNT-4,5, etc. The D-type latch 510 is clocked by an inverted clock signal (i.e., latch 510 latches when its clock signal goes form high to low), for example, base clock signal CLK 109. Accordingly, in operation, the CGC circuit provides an output clock signal (Q 525) whenever the enable signal 501 is '1', where the rate of the output clock signal 525 is a function of the rate of the incoming clock signal, which is the base clock signal CLK 109 (in this example) and the enable signal 501 (in this example).

Figure 6:
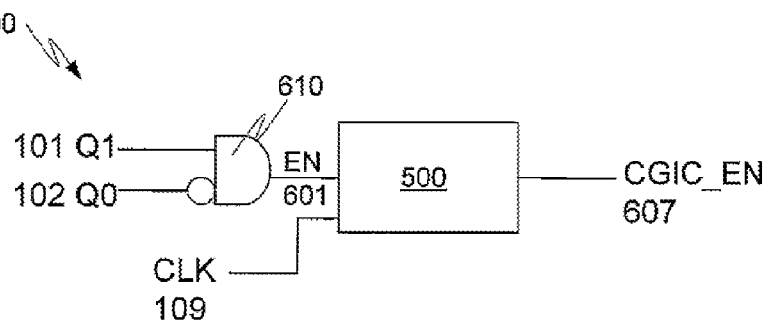
FIG. 6 is a schematic block diagram of a first CGC enable control circuit for a first portion of a counter circuit according to an embodiment of the present invention.

FIG. 6 shows an example first CGC enable control circuit 600 for a first portion of a counter circuit according to an example of the invention, for use in 8-bit and above counters (an example use of which is described in FIG. 8 below). The CGC_EN signal 607 (i.e., CGC enable) is provided by enabling the CGC circuit 500 using an enable signal 601 derived from the output of the previous combinatorial control logic instance, which in this example is an AND gate 610 arranged to detect Q1 AND /Q0. This AND gate 610 may be the same AND gate 310 as used to detect (Q1 AND /Q0) as shown in FIG. 3.

Examples of the invention that use pipelining and clock gating may be used in any counters of 4-bits and above. Higher order counters may effectively reuse blocks, but with suitable modifications to the respective inputs used (e.g., changed to use inputs Q8 to Q15, instead of Q0 to Q7), and including further connecting logic to take the input changes into account (see FIG. 11 for more details).

Figure 7:
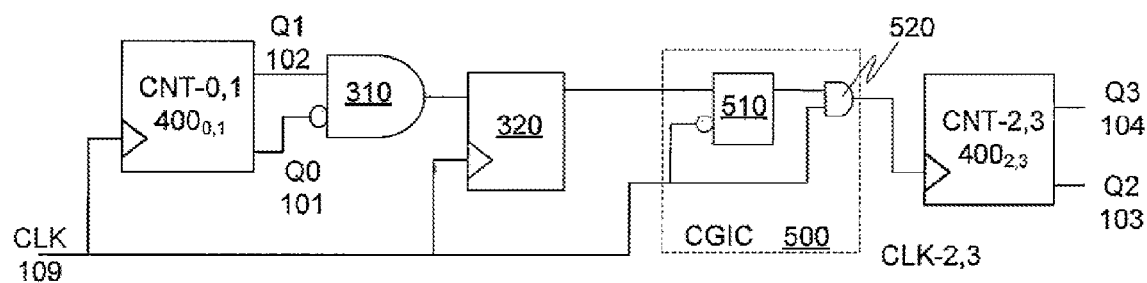
FIG. 7 is a schematic block diagram of a 4-bit counter according to an embodiment of the present invention.

FIG. 7 shows a 4-bit counter according to an example of the invention, formed from two 2-bit counter sub-modules CNT-0,1 $400_{0,1}$ and CNT-2,3 $400_{2,3}$, operatively coupled together through suitably formed pipelining and (enable) control logic circuitry, as previously described. The example (enable) control logic instance shown is formed out of an AND gate 310, pipelining D-type flip-flop 320 and CGC circuit 500, the CGC 500 being formed of a D-type latch 510 and AND gate 520. It is to be noted that the pipelining flip-flop 320 may be omitted for a 4-bit counter (as the pipelining is not needed to control higher order counter sub-modules, as would be the case in 5-bit and higher overall digital counter circuits). If the pipeline flip-flop 320 is removed, the AND gate would be arranged to use (Q1 AND Q0), instead of (Q1 AND /Q0).

The 4-bit counter of FIG. 7 operates by counting up the two Least Significant Bits (Q0 and Q1), and when Q1 and Q0 are '10' (i.e., Q1 AND /Q0) the output of AND gate 310 goes to '1' (i.e. goes high), which when the clock signal CLK 109 is clocked, makes the output of the D flip-flop 320 also go to value '1' (i.e., goes high). This enables the CGC 500 to feed the clock to the next higher order counter sub-module, e.g., CNT-2,3 $400_{2,3}$, which then starts counting as and when required.

Figure 8:
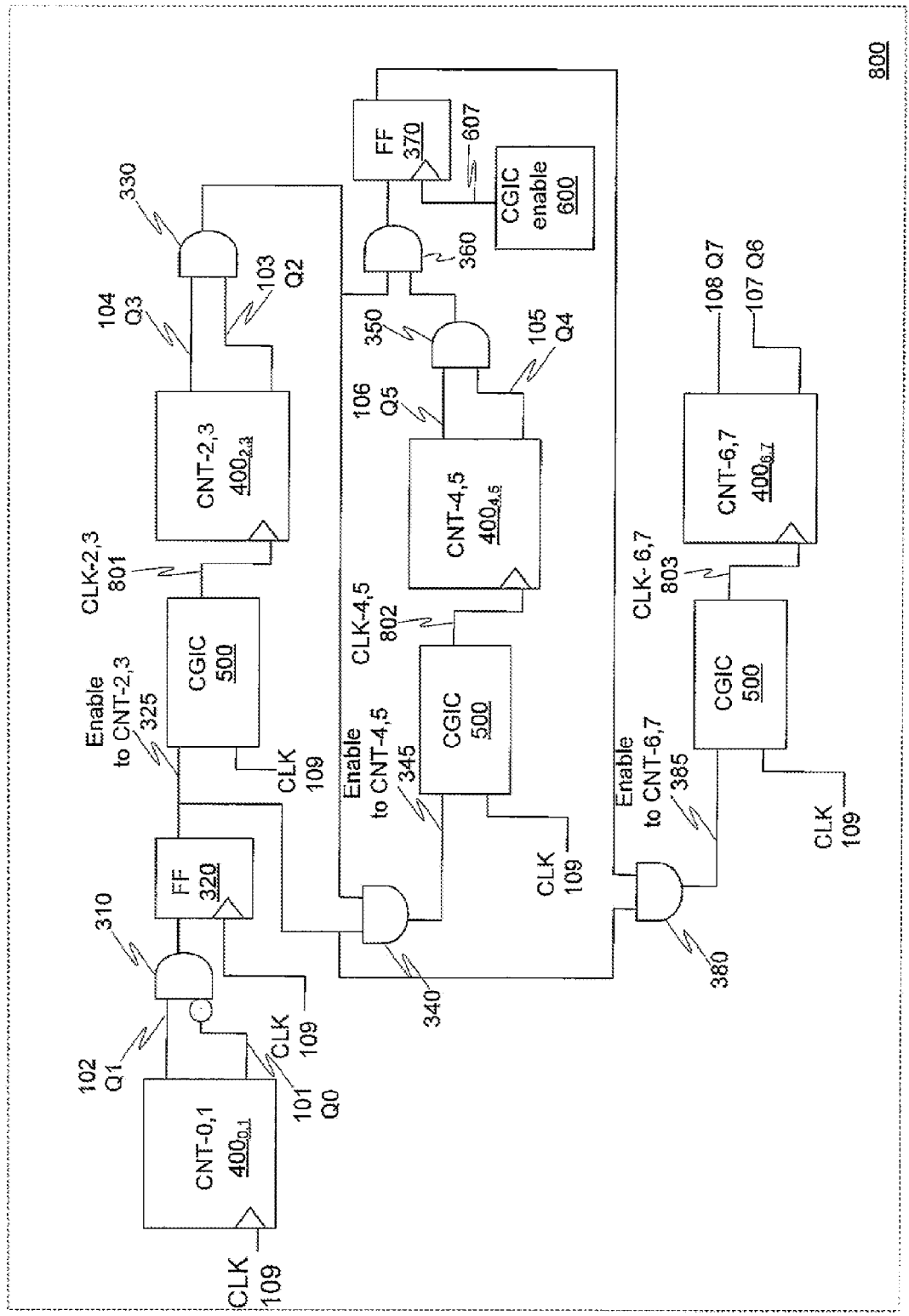
FIG. 8 is a schematic block diagram of an 8-bit counter according to an embodiment of the present invention.

FIG. 8 shows an 8-bit overall digital counter circuit 800 according to an example of the invention, and is a high performance self-gated 8-bit digital counter circuit. However, the circuit shown in FIG. 8 may also be used as a basic building block for a higher order counter, for example a 16-bit counter circuit, as described in more detail in FIG. 11.

Counter sub-modules $400_{i,i+1}$ are the basic 2-bit counter sub-modules described earlier in relation to FIG. 4 above. The flip-flops 320 and 370 are the "pipeline register" according to the pipelining approach as described above. Modules 500 are CGCs, depicted in FIG. 5 and described above, and which control the clock gating of the respective counter sub-modules $400_{i,i+1}$, as discussed in relation to FIG. 3 above.

Figure 10:
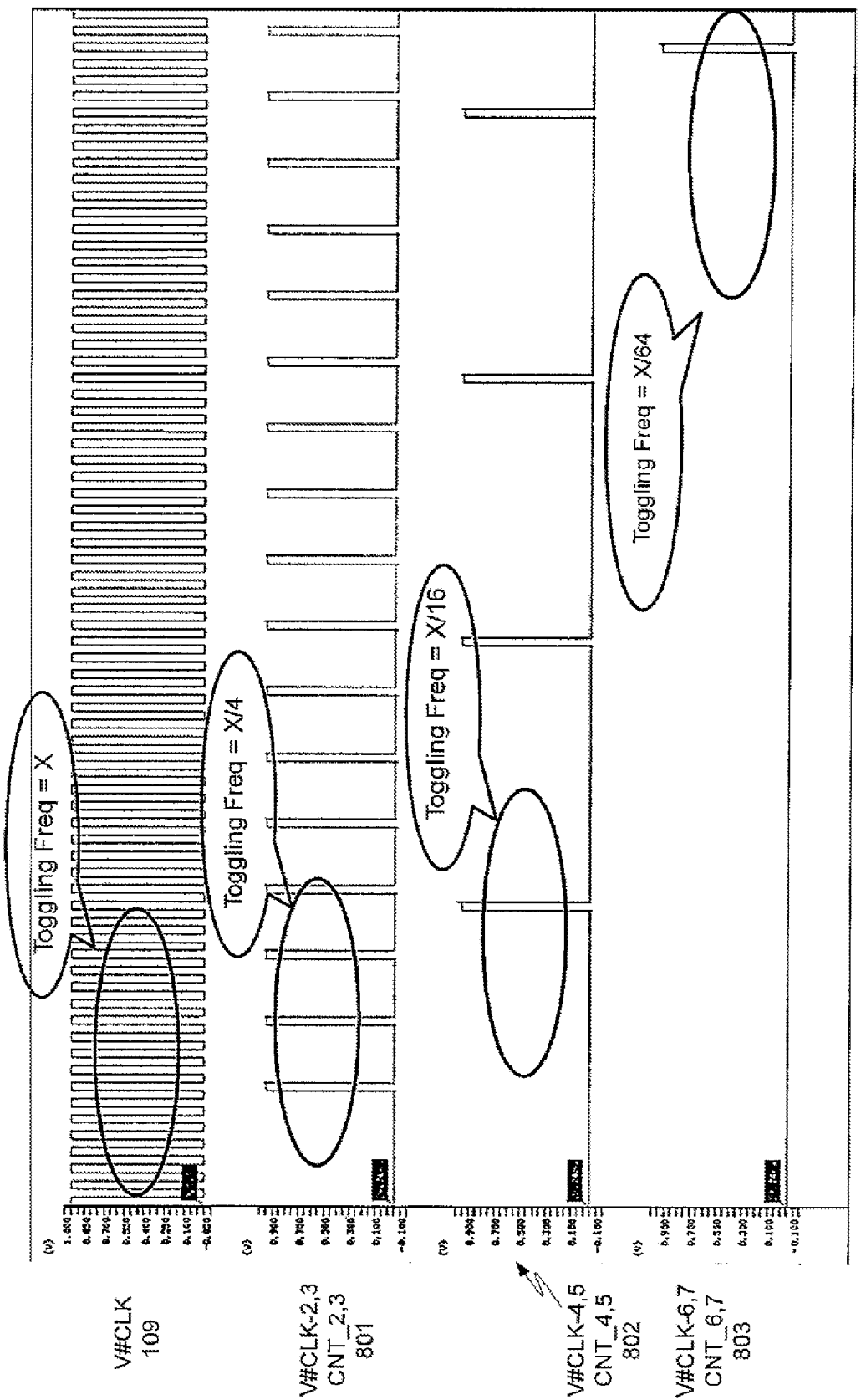
FIG. 10 is a timing diagram for a second set of signals of the circuit shown in FIG. 8 according to an embodiment of the present invention.

The high performance of the proposed overall digital counter circuit is a result of the implementation where any path from one flip-flop to another has a maximum fan-in equal to the bit depth of the counter sub-modules being used, and a maximum number of logic tier levels of 2 also—in this way, the cone size is being limited to allow faster operation. The outputs of the overall 8-bit digital counter circuit 800 are represented by Q0 through Q7 (by references 101 through 108, respectively). CLK-2,3, CLK-4,5, and CLK-6,7 are the respective clock gated versions of the input clock CLK 109, which are reduced in frequency relative to the base clock CLK 109, as shown in FIG. 10.

In FIG. 8, the 8-bit digital counter circuit 800 shown has been split into modules of 2-bit counters each. An 8-bit counter would count up to $2^8$ cycles=256 cycles in total, and therefore the most significant bit, i.e., Q7 would toggle only once during the entire operation of the counter over 256 cycles. Hence the clock to Q7 can be clock gated for all the remaining cycles. However, because examples make use of 2-bit counter sub-modules, output bits Q7, Q6 may be considered simultaneously to decide when to clock gate the block (i.e. subsequent higher order counter sub-modules). For example, since valid output values for Q7 and Q6 can be either '00', '01', '10', or '11', the 2-bit counter sub-module CNT-6,7 changes state only four times during the 256 cycles. Hence, as depicted in FIG. 10, for a base clock signal rate of X Hz, the clock to module CNT-6,7 toggles at a frequency of (X/4)*256=X/64 Hz. The toggling (i.e., clock rate) of the other 2-bit counter sub-modules are similarly reduced in rate, for example: CNT-4,5 would toggle at (X/16)*256=X/16 Hz; and CNT-2,3 would toggle at (X/64) 256=X/4 Hz.

In other examples of the invention, differently sized counter sub-modules may be used instead of the 2-bit counter sub-modules proposed here. For example, 3-bit counter sub-modules, 4-bit counter sub-modules, etc. In each case, the fan-in of the respective first tier of the combinatorial control logic instances should be arranged to match the bit depth of the counter sub-modules, so that, for example, when using 3-bit counter sub-modules to form the overall counter circuit, the combinatorial logic may make use of 3-input AND gates in the first tier, just like 2-input AND gates have been used in the first tier of the combinatorial control logic described above where 2-bit counter sub-modules have been used. Equally, when using 4-bit counter sub-modules, 4-input AND gates may be used in the combinatorial control logic, and so on. It may also be possible to use counter sub-modules of different/alternating sizes—e.g., 2-bit and 3-bit counters sub-modules within the same single higher order counter, or the like.

The clock to 2-bit counter module CNT-0,1 is not gated (as those two bits do not depend on any previous bits), so it still continues to receive the ungated clock, e.g., base clock signal CLK 109, and hence it would continue to toggle at X Hz. As discussed above, any higher order 2-bit counter sub-module would change state only after Q1 Q0 is '10' (i.e., Q1 AND /Q0). Hence, it is proposed to use (Q1 AND /Q0) for pipelining for one clock cycle, to allow for delay issues of the preceding pipelining flip-flop. Q2 Q3 would change state when Q1 Q0='10'. Hence the enable signal for CNT-2,3 would simply involve one AND gate, e.g., AND gate 310

(with a suitable logic inversion on the Q0 input). Meanwhile, Q4 Q5 would change state when Q1 Q0='10' and Q2 Q3='11', hence the enable for CNT-4,5 would use an additional 2 (making a total of 3) AND gates, as described above in FIG. 3. Similarly, Q6 Q7 would change state when Q1 Q0='10' and Q2 Q3='11' and Q4 Q5='11', hence the enable for CNT-6,7 would use an additional 2 (making a total of 4) AND gates, also shown in FIG. 3 above.

In some examples of the invention, the first pipelining flip-flop 320 may be omitted, as the combinatorial control logic up to that point (i.e., the single AND gate 310) does not exceed the fan-in/control logic tier limitations otherwise enforced for the later pipelining portions of the invention. In this case, the AND gate could be arranged to determine Q1 AND Q0 (i.e., there is no inversion of the LSB Q0 input), because the lack of a pipelining flip-flop 320 means there is no 1 clock cycle delay. This is to say, the logic gate arrangement is arranged to detect the logic combination preceding 1 clock cycle before the higher order bit toggles, rather than the logic combination 2 clock cycles before (see lines 12 and 13 of the state diagram 110 of FIG. 1).

Figure 9:
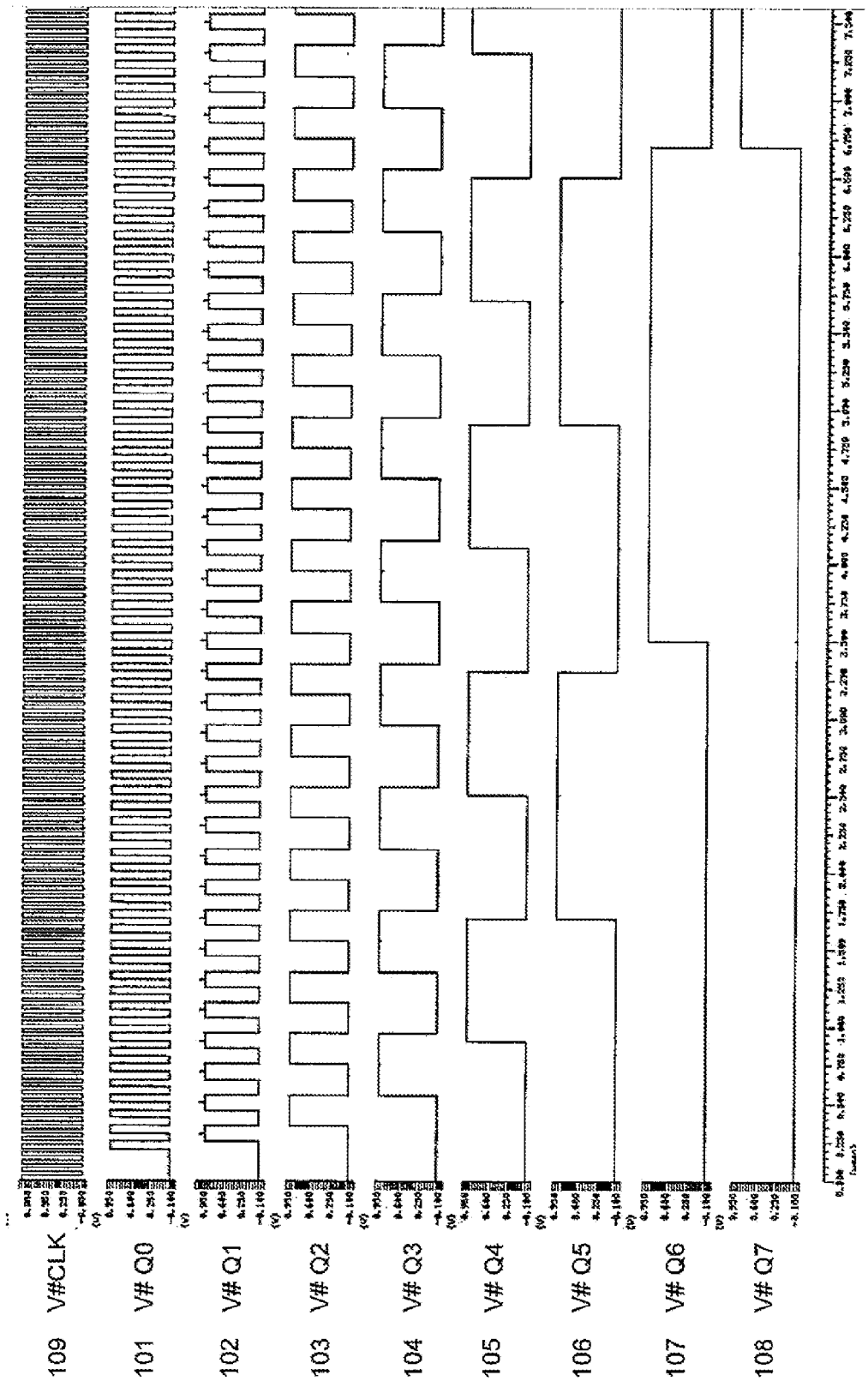
FIG. 9 is a timing diagram for a first set of signals of the circuit shown in FIG. 8 according to an embodiment of the present invention.

FIG. 9 shows a timing diagram for a first set of signals shown in FIG. 8 according to an example of the invention, where the first set of signals are the respective outputs of Q0 101 to Q7 108, in relation to the base clock signal CLK 109. In summary, each higher order output bit operates at half the frequency of the previous output bit, in order to provide the (upwards, for this example) binary count output when summed together.

FIG. 10 shows a timing diagram for a second set of signals shown in FIG. 8 according to an example of the invention, where the second set of signals are the signal outputs of the respective CGCs, i.e., gated clocks CLK-2,3 801, CLK-4,5 802, CLK-6-7 803 which are the clock inputs to the respective counter sub-modules CNT-2,3; CNT-4,5; and CNT-6,7 of FIG. 8. Figure has 4 waveforms where the top most signal is the base clock signal CLK 109, below which is CLK-2,3 801 (the reduced rate clock signal for the second 2-bit counter sub-modules, which deals with the overall counter output bits Q2 and Q3), followed by CLK-4,5 802 (the further reduced rate clock signal for the third 2-bit counter sub-modules, which deals with the overall counter output bits Q4 and Q5) and last one is CLK-6,7 803 (the yet further reduced rate clock signal for the fourth 2-bit counter sub-module, which deals with the overall counter output bits Q6 and Q7). If base CLK 109 is assumed to be a signal of frequency X, then signal CLK-2,3 801 has a toggling frequency of X/4 which means that counter module CNT-2,3 (400$_{2,3}$) would toggle at a frequency of X/4. Similarly, 2-bit counter sub-module CNT-4,5 would toggle at a frequency of X/16 and 2-bit counter sub-module CNT-6,7 at a frequency of X/64. Since dynamic power of an integrated circuit is directly dependent on the operating frequency, the proposed counter circuit consumes less dynamic power as compared to conventional approaches, because higher order portions are clocked at a lower rate, or not at all.

Figure 11:
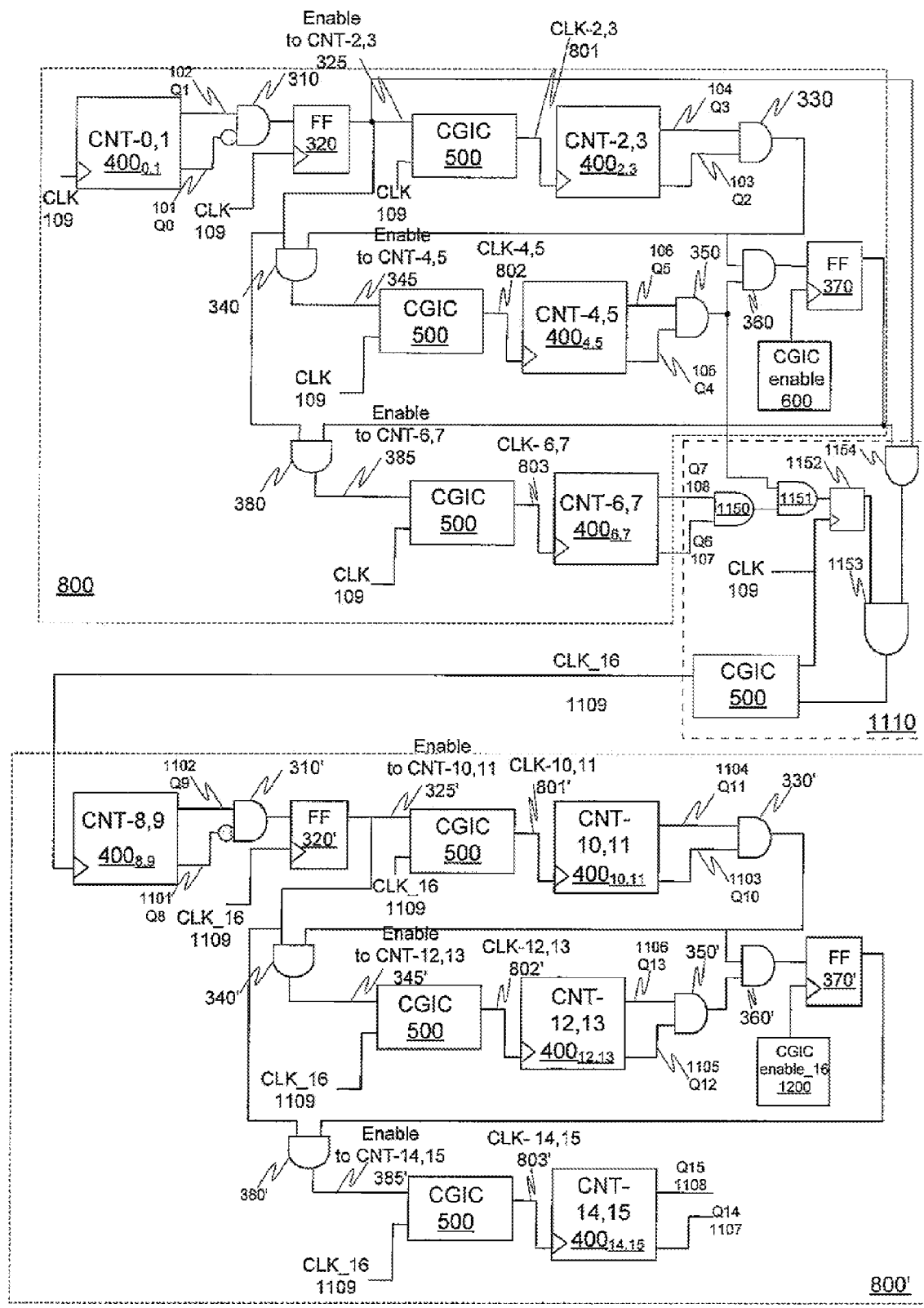
FIG. 11 is a schematic block diagram of a 16-bit counter in accordance with an embodiment of the present invention.
Figure 12:
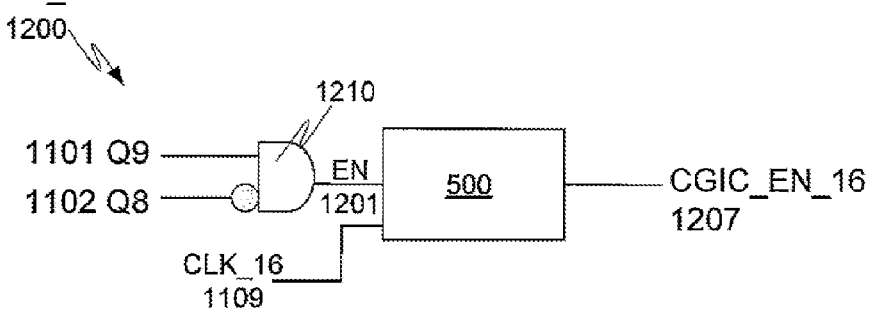
FIG. 12 is a schematic block diagram of a second CGC enable control circuit for a second portion of a counter circuit in accordance with an embodiment of the present invention.

FIG. 11 shows an overall 16-bit digital counter circuit according to an example of the invention, formed from the same 8-bit counter 800 of FIG. 8, but further including a second 8 bit counter portion 800' arranged to operate for bits Q8 to Q15 (in a similar fashion to how the 8-bit portion 800 operates for bits Q0 to Q7), and with a connective logic portion 1110. The second 8 bit counter portion 800' acts like Q0 is equivalent to Q8, and Q7 is equivalent to Q15, etc. The connective logic portion 1110 comprises four two input AND gates 1150, 1151, 1153 and 1154, and a pipelining flip flop 1152, all operatively coupled together to control a further CGC 500 under operation of the base clock CLK 109. The output of the CGC 500 in the connective logic portion 1110 is referred to as CLK__16 1109, and is then used to replace the base clock CLK 109 in the second 8 bit counter portion 800'. The other control logic change, compared to the standard 8-bit counter 800, is the use of a CGC_enable__16 signal 1207, from CGC_enable__16 circuit 1200, an example of which is shown in more detail in FIG. 12, from where it can be seen that it is the same construction as the CGC enable circuit in FIG. 6, but where the two inputs are /Q8 1102 and Q9 1101 instead of /Q0 101 and Q1 102. Again, the enable signal 1201 may be derived directly from a combinatorial control logic gate (as shown in the figure).

A 32-bit counter may be provided based on the principle described herein in a similar way, i.e., re-using suitable portions, such as, for example, using two 16-bit counter sub-portions together (which themselves, are each two 8-bit portions suitably linked together, as shown in FIG. 11). In this case, the second 16-bit block may utilise a CLK__32 clock signal, derived in a similar fashion to CLK__16 shown in FIG. 11, but going down to a lower frequency (e.g., half of CLK__16).

Figure 13:
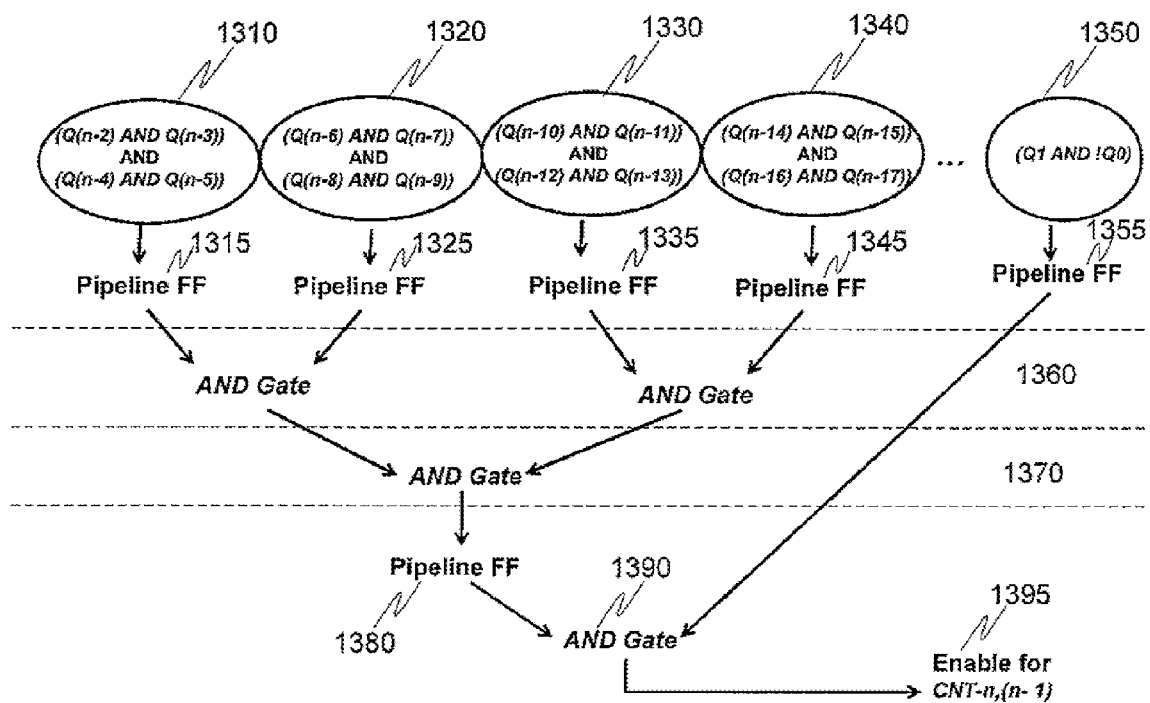
FIG. 13 illustrates generic counter enable logic for an n-bit counter using 2-bit counter (sub-)modules in accordance with an embodiment of the present invention.

FIG. 13 shows an example of a generic pipelined counter enable logic for the CNT-n,(n−1)th module of any higher order digital counter circuit according to an example of the invention that uses 2-bit counter sub-modules. The top row shows a number of logical ANDings—depicted as ovals 1310 to 1350—which adhere to the restrictions noted above, i.e., being up to dual, 2-input AND logic gates. They are shown starting with the equation operating on the most significant bits on the left, moving down to the least significant bits on the right, and the naming protocol in use in the figure is where the variable "n" is the order of the most significant bit of an overall (n+1)-bit digital counter circuit to be described by the figure. For example, for a 16-bit counter, starting from Q0 and going to Q15, "n" would be 15, similarly, for an 8-bit counter, starting from Q0 and going to Q7, "n" would be 7.

Thus, for example, the left most logical ANDing 1310 is: (Q(n−2) AND Q(n−3)) AND (Q(n−4) AND Q(n−5)), so that, if a 16-bit overall counter is being described, 'n'=15, which means the equation resolves to: (Q(15−2) AND Q(15−3)) AND (Q(15−4) AND Q(15−5))=(Q13 AND Q12) AND (Q11 AND Q10).

The next logical ANDing 1320 is: (Q(n−6) AND Q(n−7)) AND (Q(n−8) AND Q(n−9)), so that, if a 16-bit overall counter is being described, 'n'=15, which means the equation resolves to: (Q(15−6) AND Q(15−7)) AND (Q(15−8) AND Q(15−9))=(Q9 AND Q8) AND (Q7 AND Q6). The system continues in the same way for the other logical ANDings 1330, 1340, etc. Note, the Figure is generalised, and so the number of logical ANDing's vary with the bit depth of the overall digital counter circuit being created.

Equally, if an 8-bit overall digital counter circuit is being described by the figure, 'n'=7, which means the equation resolves to: (Q(7−2) AND Q(7−3)) AND (Q(7−4) AND Q(7−5))=(Q5 AND Q4) AND (Q3 AND Q2), etc. This process continues until the final AND logic gate, which is always an AND combination of the least significant bits, with the absolute least significant bit (Q0) being the inverted version—i.e., /Q0.

As mentioned above, each of the logical ANDings 1310-1340 match the restrictions on the number of logic tiers and fan-in of the control logic noted above, and each are followed by use of a pipelining flip-flop—i.e. flip-flops 1315, 1325, 1335, 1345 and 1355. Each pipelined flip-flop (1315-1355) may form one input to another 2-input AND gate at a first tier 1360 of the next set of combinatorial control logic (e.g., pipeline flip-flop 1315 and pipeline flip-flop 1325 are the two input to AND gates in logic level 1360), with those AND gates in the first tier 1360 providing the input to second tier 1370 2-input AND gate, as shown in the figure. Then another pipelining flip-flop 1380 is used and the logic continues on in this arrangement of using two tiered (i.e. dual) 2-input logic gates between each pipelining flip-flop, until the LSBs are encountered. Thus, the described convention here is that: whenever you reach the output of a dual 2-level 2-input AND gate, the output is pipelined, and this is kept being done until there is just one output which will, in the end, be ANDed with the pipelined LSBs (i.e., Q1 AND /Q0) by final AND gate 1390, whose output is the enable signal for the next counter sub-module 1395.

Figure 14:
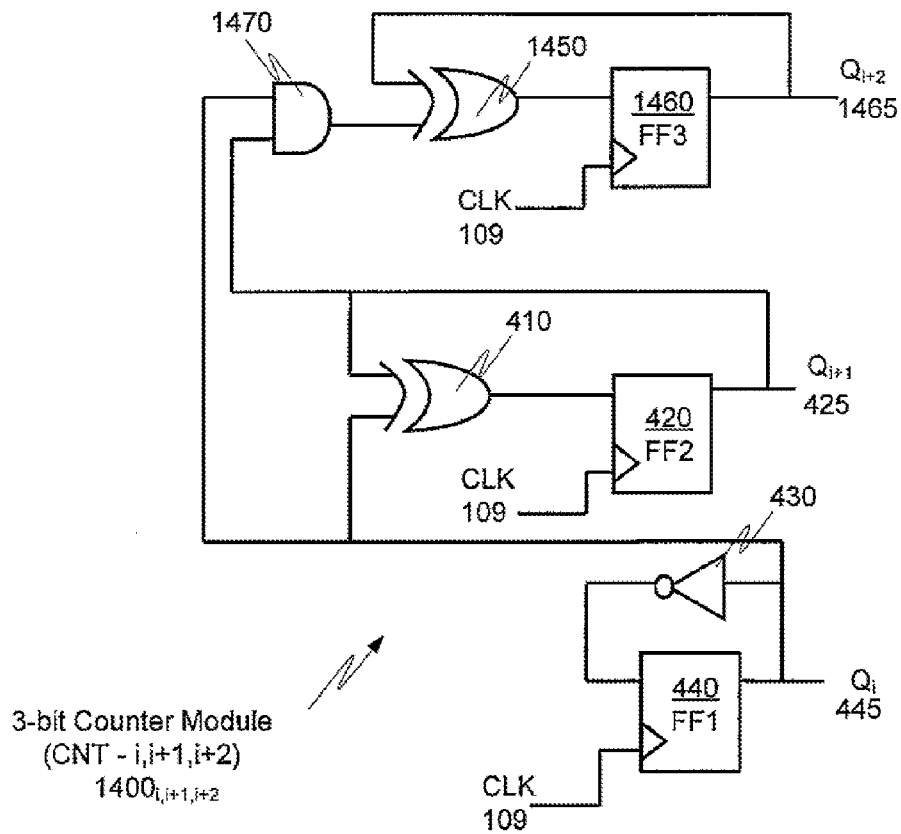
FIG. 14 is a schematic block diagram of a 3 bit counter (sub-)module in accordance with an embodiment of the present invention.

FIG. 14 shows an example 3-bit counter (sub-) module 1400$_{i,i+1,i+2}$ according to an example of the invention. It is in a form very similar to the 2-bit counter sub-module shown in FIG. 4 (and utilises the same reference numerals for the same items), except it now has an additional 2 logic gates (AND gate 1470 and XOR gate 1450) and a third flip-flop 1460, which produces the further counter module output Q$_{i+2}$ 1465. This circuit operates as a basic 3-bit counter.

Figure 15:
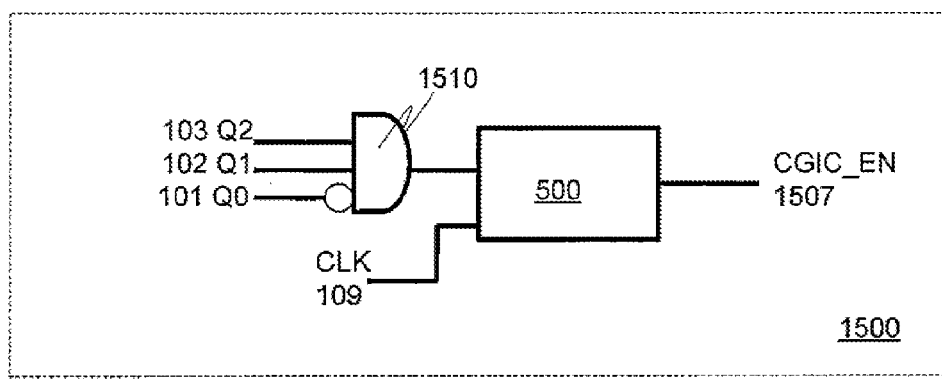
FIG. 15 is a schematic block diagram of a Clock gating cell (CGC) for use in clock gating the counter modules of FIG. 14 when they are not changing state according to an embodiment of the present invention.

FIG. 15 shows an example of a Clock Gating Cell (CGC) 1500 for use in clock gating the lower order 3-bit counter sub-modules, as shown in FIG. 14 when they are not changing their states, according to an example of the invention. It can be seen that this is essentially similar to the CGC of FIG. 5, except it now utilises a 3-input AND gate 1510 (with an inversion on the LSB, Q0) instead of the 2-input AND gate (with inversion of Q0) found previously. This 3-input AND gate 1510 produces the respective enable signal, e.g., enable signal 1507. This formation fits into the above-described generalised limitation on the cone size (i.e., fan-in and tier combination).

Figure 16:
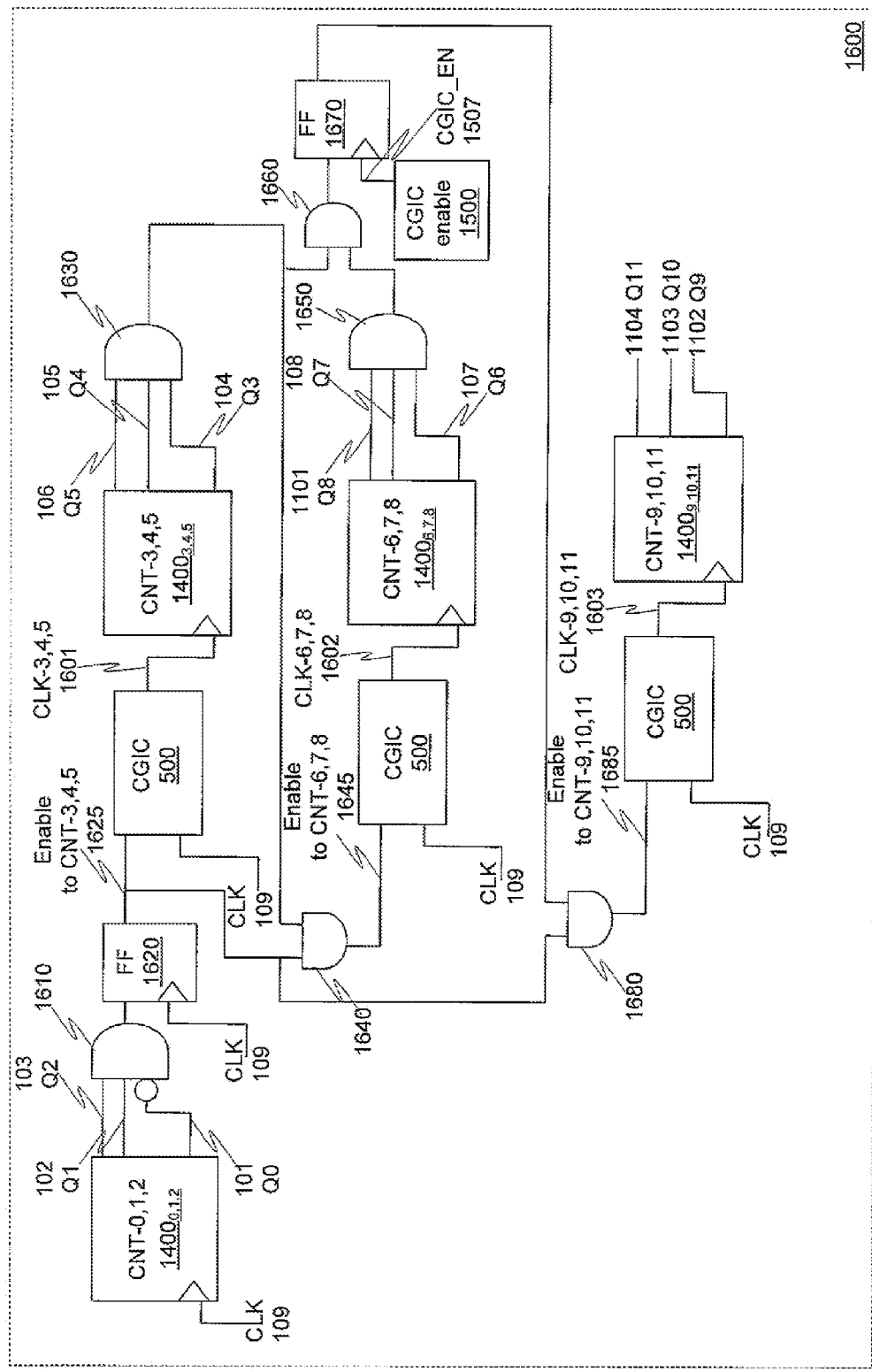
FIG. 16 is a schematic block diagram of a 12-bit counter according to an example of the present invention that uses a plurality of 3-bit counter (sub-)modules of FIG. 14.

FIG. 16 shows a 12-bit counter 1600 according to an example of the invention that utilises a plurality of 3-bit counter sub-modules (e.g., from FIG. 14), instead of the 2-bit counter sub-modules of FIG. 7, 8 or 11. The formation of the 12-bit counter is largely the same as shown in and described with reference to FIG. 8 above, except the first tier AND gates 1610, 1630, and 1650 are all 3-input (while the second tier AND gates 1640 and 1660 remain 2-input). The rest of the figure corresponds to that shown in FIG. 8, save for the remaining reference numbers being converted to start with '16' rather than '8', to match the figure number.

Thus, the 12-bit counter circuit 1600 starts off with a first 3-bit counter sub-module CNT-0,1,2 1400$_{0,1,2}$, clocked by the base clock signal 109, followed by a second 3-bit counter sub-module CNT-3,4,5 1400$_{3,4,5}$, clocked by the reduced rate clock signal CLK-3,4,5 1601.

Similarly, a third 3-bit counter sub-module CNT-6,7,8 1400$_{6,7,8}$, is clocked by the yet further reduced rate clock signal CLK-6,7,8 1602, and a fourth 3-bit counter sub-module CNT-9,10,11 1400$_{9,10,11}$, is clocked by the still yet further reduced rate clock signal CLK-9,10,11 1603.

Each clocking signal (e.g. 1601, 1602, and 1603) is provided by the output of a respective CGC controlled by a respective combinatorial control logic instance that provides the enable signal (e.g., enable signal to CNT-3,4,5 1625) to the CGC 500. In this example, since the counter sub-modules in use are 3-bit, each respective combinatorial control logic instance is formed from 3-input AND gates (e.g., AND gate 1610) in the first tier, pipelined (e.g. by flip-flop 1620) into a 2-input AND gate in the second tier (e.g., AND gate 1640) whose other input is the output of another 3-input AND gate (e.g., AND gate 1630) combining the next set of bits (e.g., bits Q3, Q4 and Q5).

Figure 17:
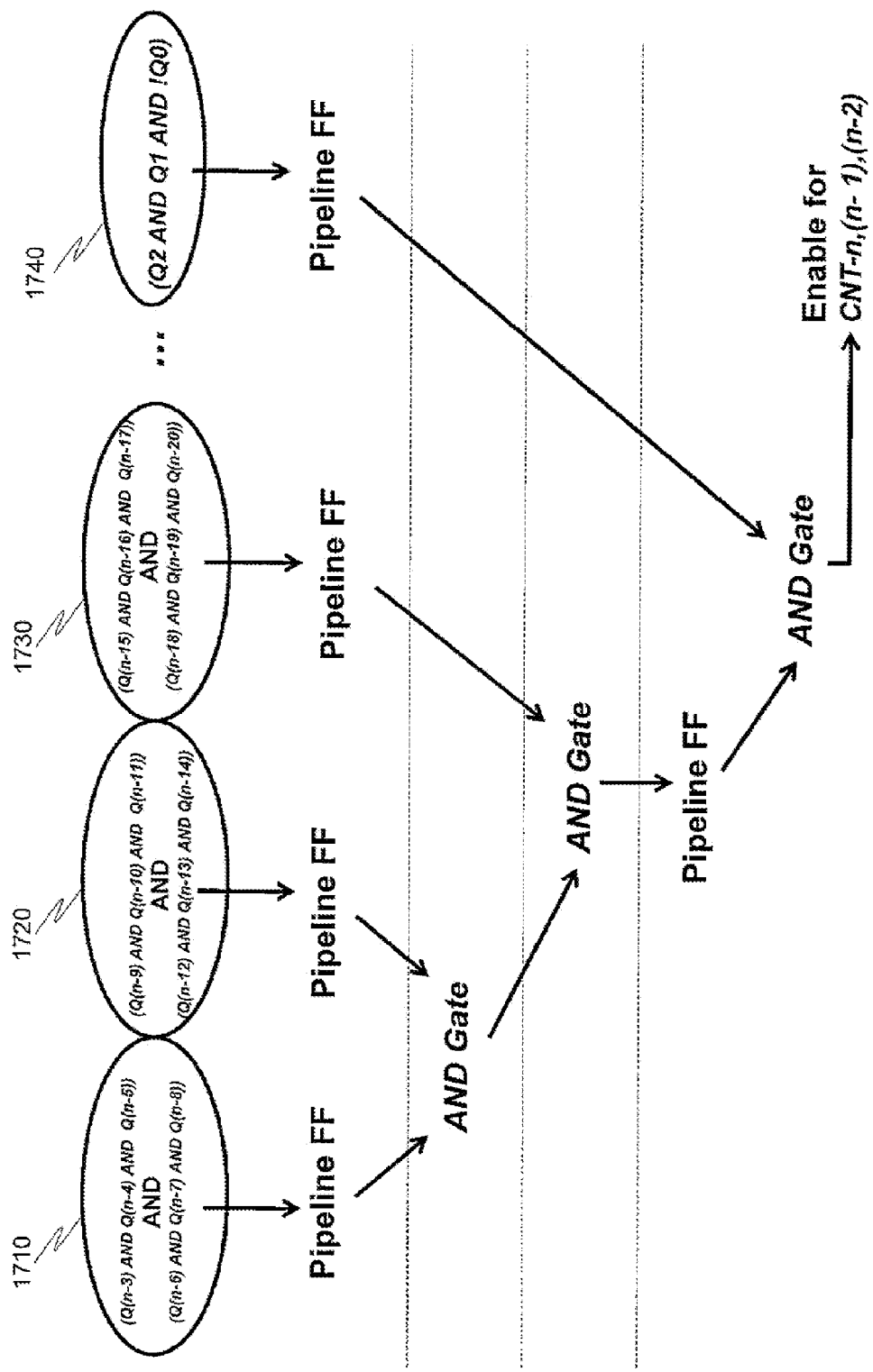
FIG. 17 illustrates generic counter enable logic for an n-bit counter using 3-bit counter (sub-)modules in accordance with an embodiment of the present invention.

FIG. 17 shows a generic counter enable logic for an n-bit counter using 3-bit counter sub-modules according to an example of the invention. This is again similar to that shown in FIG. 13, but extrapolated out for using the 3-input AND gates, where appropriate. For example, each of the left most circled logic combinations at the top of the figure (i.e., items 1710, 1720 and 1730) are the combination by a 2-input AND gate of the output s of two 3-input AND gates. Meanwhile, right most circled logic (i.e., for the 3 LSBs, where the absolute LSB is inverted) is a single 3-input AND gate. Again, pipelining flip-flops are used after the limitation of dual 3-input AND gates in a first tier of logic gates, coupled to a second tier of a single 2-input AND gate is reached.

As will be appreciated, increasing the fan-in of any logic restricts its potential maximum operating frequency. This applies to all the control logic described herein, and, as such this means the examples using 2-bit counter sub-modules may operate at a higher frequency than examples using higher order (i.e., higher bit depth) counter sub-modules, e.g., 3-bit counter sub-modules of FIG. 14, 4-bit counter sub-modules, etc.

The described pipelining technique is particularly applicable to all counters that are higher order than 4-bit (i.e. 5 bit+counters), since this is where the combinatorial control logic would otherwise start to increase its fan-in. In general terms, the pipelining concept disclosed herein in combination with clock gating may be described as limiting each instance of the combinatorial control logic (for the next clock counter sub-module in the overall counter) to two tiers of logic gates, where the fan-in (i.e., number of inputs) of the first tier of control logic gates matches the bit depth of the respective counter sub-modules in use, and the second tier is always two input, hence a fan-in of 2. Thus, when using 2-bit counter sub-modules (the fastest, optimum, formation of a counter), the first tier is two-input. Whereas, if an example is to use 3-bit counter sub-modules, the first tier is 3-input, or if using 4-bit counter sub-modules, the first tier is 4-input, etc.

In the foregoing specification, the term 'clock gating', e.g., of the respective 2-bit or 3-bit counter sub-modules, is used. The clock gating described generally involves a flip-flop or multiple flip-flops that do not receive a direct clock signal, but receive the clock signal from the output of a clock gating cell depicted in FIG. 5, whose enable is controlled in a manner such that it would stop the clock to those flip-flops when the respective flip-flop outputs are not required to change. Clock gating a flip-flop(s) means that you are "gating" (in layman's term: stopping) the clock to that particular flip-flop(s). Every flip-flop receives a "clock" signal. Even if the output (normally represented by Q) of a flip-flop does not change, it still continues to consume dynamic power as long as it is receiving the clock signal. In order to save power, it is therefore desired to "gate-the-clock" whilst the output of the respective flip-flop is not required to change.

Any ripple delay in the overall counter circuit may be overcome by use of the pipelining approach, because the combinatorial logic may be formed to take a suitably delayed/pre-delayed signal rather than the signal when/just before the respective change(s) occurs. For example, the ripple delay that would be associated with the detecting when Q1 AND Q0 are 1, may be overcome by instead looking for the logic change one clock cycle previous—i.e., Q1 AND /Q0. This is possible because a counter has a rigidly defined output sequence, being a one bit increase in output value per clock cycle, and which has a regular pattern.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, in a System on Chip integrated circuit design. Alternatively, the examples may be implemented as any number of separate integrated circuits or separate devices interconnected with each other in a suitable manner. For example, as a discrete counter circuit in its own package for use on a Printed Circuit Board (PCB) or the like.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Unless otherwise stated as incompatible, or the physics or otherwise of the embodiments prevent such a combination, the features of the following claims may be integrated together in any suitable and beneficial arrangement. This is to say that the combination of features is not limited by the specific form of claims, particularly the form of the dependent claims, such as claim numbering and the like.

The invention claimed is:

1. An n-bit counter circuit formed from a plurality of cascading counter sub-modules, comprising:
combinatorial control logic coupled to a lower order counter sub-module of the counter circuit, wherein the control logic is arranged to clock gate at least one higher order counter sub-module of the counter circuit dependent on a logical combination of outputs of the lower order counter sub-module, wherein the control logic uses pipelining to store at least one previous control logic output for use in determining a later control logic output; and at least one clock gating cell coupled between the lower order counter sub-module and the higher order counter sub-module, wherein the clock gating cell controls a clock input of the higher order counter sub-module and comprises, a latch having an output operatively coupled to a first input of a two input AND gate, wherein the latch is operated by a falling level of a clock signal, and the clock signal is operatively coupled to a second input of the two input AND gate; and an input to the latch is a logically ANDed output of the lower order counter sub-module.

2. The n-bit counter circuit of claim 1, wherein the plurality of cascading counter sub-modules have a bit depth and the control logic comprises two tiers of logic gates, wherein the first tier of logic gates forms at least one input to a second tier logic gate, the first tier has a fan-in equal to the bit depth of the counter sub-modules, and the second tier has a fan-in of two.

3. The n-bit counter circuit of claim 2, wherein the first and second tiers of logic gates comprise AND gates.

4. The n-bit counter circuit of claim 1, wherein the pipelining comprises a flip-flop arranged to store the at least one previous control logic output for use in determining a later combinatorial control logic output dependent on a clock signal.

5. The n-bit counter circuit of claim 1, wherein the pipelining is operable to ensure a fan-in of a first tier of combinatorial control logic gates is equal to a bit depth of the plurality of cascading counter sub-modules.

6. The n-bit counter circuit of claim 1, wherein the lower order counter sub-module is operable to count a two least significant bits of the counter circuit and the higher order counter sub-module is operable to count a next two more significant bits of the counter circuit; and wherein the input to the latch is the logically ANDed output of the lower order counter sub-module and wherein a least significant bit input to an AND gate operably coupled to the output of the lower order counter sub-module is an inverted input.

7. The n-bit counter circuit of claim 1, wherein each two of the plurality of counter sub-modules have the clock gating cell coupled therebetween.

8. The n-bit counter circuit of claim 1, wherein the lower order counter sub-module is operable to count a two least significant bits of the counter circuit and the higher order counter sub-module is operable to count a next two more significant bits of the counter circuit.

9. The n-bit counter circuit of claim 1, wherein the n-bit counter is a higher than 4-bit counter.

10. The n-bit counter circuit of claim 1, wherein the counter circuit is formed from a plurality of 2-bit counter sub-modules, and the combinatorial control logic is arranged to ensure a maximum fan-in of the combinatorial control logic of 2.

11. The n-bit counter circuit of claim 10, wherein the combinatorial control logic comprises a first tier of two, 2-input AND gates, and a second tier of a single 2-input AND gate.

12. The n-bit counter circuit of claim 11, wherein the control logic further comprises a flip-flop operatively coupled between an output of the first tier of logic gates, and an input to the second tier logic gate.

13. The n-bit counter circuit of claim 12, wherein the flip-flop is clocked by a base clock signal.

14. The n-bit counter circuit of claim 1, wherein there is a control logic instance per instance of a higher order counter sub-module of the counter circuit.

15. The n-bit counter circuit of claim 1, wherein the at least one higher order counter sub-module of the counter circuit is the next higher order counter sub-module after the lower order counter sub-module.

16. The n-bit counter circuit of claim 1, wherein the plurality of cascading counter sub-modules comprises a first, lowest order, counter sub-module followed by a second, higher order, counter sub-module cascaded off the first counter sub-module, and wherein each subsequent counter sub-module cascades off a previous counter sub-module and is a yet higher order counter sub-module.

17. An n-bit counter circuit including an initial 4-bit counter sub-portion, wherein the 4-bit counter sub-portion comprises:

a first 2-bit counter sub-module arranged to count a two least significant output bits Q0 and Q1 of the n-bit counter circuit;

a second 2-bit counter sub-module arranged to count a next two more significant output bits of the n-bit counter circuit, Q2 and Q3; and combinatorial control logic arranged to control a clock of the second 2-bit counter sub-module dependent on the outputs of the first 2-bit counter sub-module;

wherein the control logic comprises:

an AND gate arranged to determine a logical AND combination of Q1 and Q0; and a clock gating cell operable to clock gate the second 2-bit counter sub-module.

18. The n-bit counter circuit of claim 17, wherein the clock gating cell comprises:

a latch having an output operatively coupled to a first input of a two input AND gate, wherein the latch is operated by a falling level of a clock signal, and the clock signal is operatively coupled to a second input of the two input AND gate; and an input to the latch is a logically ANDed output of the lower order counter sub-module.

19. The n-bit counter circuit of claim 17, wherein the logical combination of Q1 and Q0 is (Q1 AND /Q0) and the control logic further comprises a pipelining flip-flop arranged to store an output of the AND gate dependent on a base clock signal.

* * * * *